Figure 1:
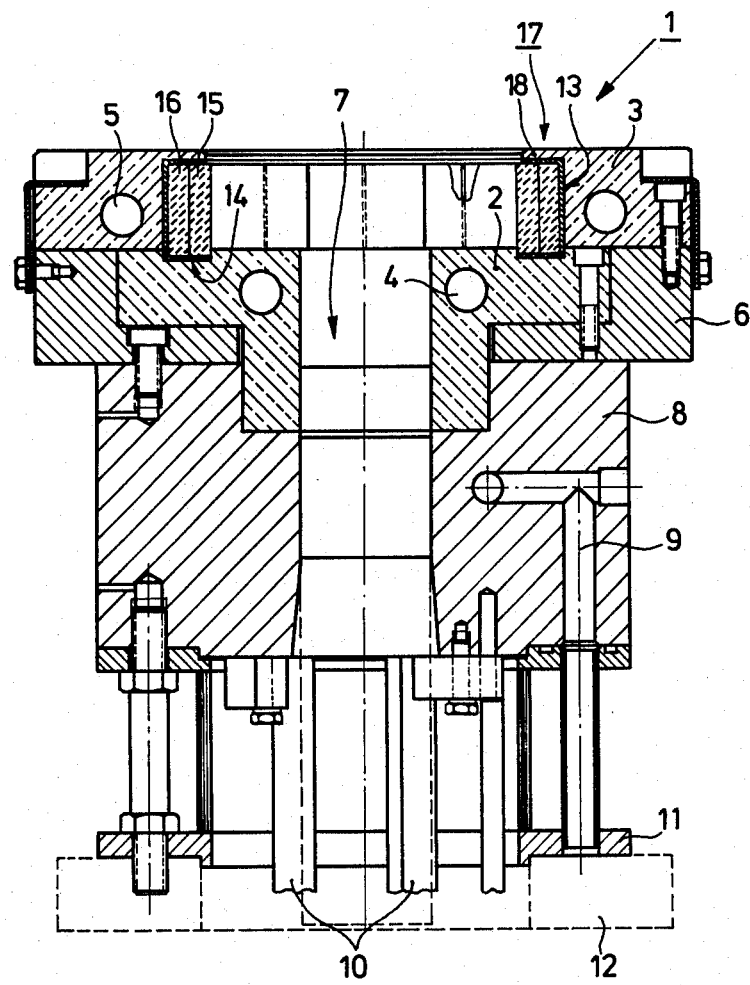

United States Patent [19]

Bauer et al.

[11] Patent Number: 4,613,306
[45] Date of Patent: Sep. 23, 1986

[54] EVAPORATOR CRUCIBLE FOR VACUUM DEPOSITING SYSTEMS

[75] Inventors: Volker Bauer; Albert Feuerstein, both of Neuberg; Horst Ranke, Alzenau, all of Fed. Rep. of Germany

[73] Assignee: Leybold-Heraeus GmbH, Cologne, Fed. Rep. of Germany

[21] Appl. No.: 729,675

[22] Filed: May 2, 1985

[30] Foreign Application Priority Data

May 30, 1984 [DE] Fed. Rep. of Germany ....... 3420246

[51] Int. Cl.⁴ ...................... F27B 14/10; C23C 16/00; H01J 37/305; H05B 6/16
[52] U.S. Cl. .................................... 432/264; 118/726; 373/10; 373/163; 373/164; 432/265
[58] Field of Search ................ 432/264, 265; 118/726, 118/727; 373/10, 163, 164

[56] References Cited

U.S. PATENT DOCUMENTS 4,153,005  5/1979  Norton et al. ................... 118/726
4,159,891  7/1979  Schmidt et al. .................... 432/264

FOREIGN PATENT DOCUMENTS 426868  4/1935  United Kingdom ............... 432/264
3078  6/1983  United Kingdom ............... 432/265

Primary Examiner—John J. Camby
Attorney, Agent, or Firm—Felfe & Lynch

[57] ABSTRACT

Evaporator crucible for vacuum depositing systems, having a crucible bottom with at least one bottom opening for the introduction of material in rod form for evaporation. At a distance from the bottom opening there is provided at least one metal crucible rim which preferably is provided with a coolant passage. To solve the problem of reducing the heat losses, the crucible rim is provided internally on at least a part of its depth with a lagging comprising ceramic material. This lagging preferably comprises individual ceramic building blocks which are preferably compressed from magnesium oxide.

6 Claims, 2 Drawing Figures

EVAPORATOR CRUCIBLE FOR VACUUM DEPOSITING SYSTEMS

This invention relates to an evaporator crucible for vacuum depositing systems, having a crucible bottom with at least one bottom opening for the introduction of material in rod form for evaporation, and with a metal crucible rim disposed at a distance from the crucible bottom and provided with a cooling passage.

As used herein and in the claims, the term "metal" includes one or more metals and/or one or more metal alloys. In an evaporator crucible of this kind disclosed by German Federal OS No. 28 21 130, the material for evaporation, which as a rule is metal, is in contact with parts of the crucible which are also made exclusively of metal and are water-cooled to prevent their being melted by the heating energy (electron beam bombardment). The water cooling results in the formation of a "skull" of solidified evaporation material. This skull prevents direct contact of the melt with the crucible material, but causes a considerable loss of heat from the evaporation material to the coolant.

This results in the inefficient utilization of the input electrical energy, of which only a small part can be converted to heat for evaporation.

The manufacture of magnetic tapes by means of electron beam evaporators is increasing. Usually, the evaporation of the material is likewise performed from a water-cooled evaporator crucible of the kind described in German Federal OS No. 28 21 130, whose longest axis is perpendicular to the direction of tape movement. The substrate consists of a thin plastic film (polyester, for example), which is wound on a roll and unwinds onto a second roll in a vacuum after coating, while in contact with a cooling cylinder. One roll of such tape has a length of about 12,000 meters. Since sufficient evaporation material must be available for such a substrate length, provision must be made for a sufficient feed of the material during the vapor depositing process.

Special advantages are offered by feeding material from the bottom of the crucible, since this eliminates the otherwise inevitable shading which is produced from above when the material is fed laterally and can result in a partial solidification of the molten metal. The advantage of feeding the material from the bottom, however, is offset, as already stated, by appreciable losses of energy to the cooling water.

U.S. Pat. No. 3,491,992 discloses the use of evaporator crucibles of ceramic materials, which can comprise several layers of different ceramic material to extend crucible life. Such crucibles have substantially lower heat losses, but their life expectancy falls far short of the life expectancy of water-cooled metal crucibles. In ceramic crucibles, however, the feeding of material through the crucible bottom presents problems on account of the different expansions of the materials on the one hand, and on account of the great danger of breakage of the brittle ceramic on the other, so that the use of "bottom feed" in ceramic crucibles has not been widely accepted.

It is, therefore, an object of the invention to devise an evaporator crucible of the kind described above, in which, despite the use of metal materials for important components of the crucible, and despite feeding material from the bottom, substantially lower heat losses occur and the utilization of energy is improved.

This object is achieved in accordance with the invention, in the evaporator crucible of the kind described above, by the fact that the rim of the crucible is provided internally on at least part of its depth, with a lagging comprising ceramic material.

By means of the invention it is possible to combine continuous material feed from the bottom of the crucible with the advantages of a ceramic crucible, without thereby having to surrender the principle of the predominant use of metal (copper) components. For it has surprisingly been found that the efficiency losses do not occur uniformly at the surfaces of the crucible rim and crucible bottom, but that the losses occur mainly at the metal rim of the crucible. We have discovered this by making measurements by means of separate coolant passages in the crucible bottom, on the one hand, and in the crucible rim on the other, and extrapolating them to the corresponding surface areas.

By means of the invention it has easily been possible to double the energy efficiency.

At the same time, in connection with the thermal expansion of the lagging, it is especially advantageous for the ceramic lagging to comprise individual ceramic building blocks with expansion joints between them.

It is again especially advantageous for the ceramic lagging to comprise at least two rows of ceramic blocks whose joints are offset from one another. In this manner the metallic evaporation material is prevented from penetrating in the molten state through the joints to the metal rim of the crucible.

Additional advantageous effects were produced when the ceramic blocks were not brought directly in contact with the water-cooled components of the crucible, but instead strips of NCT metal alloy were placed between the ceramic blocks and the metal components of the crucible. NCT is an abbreviation commonly used by the German company Krupp, Essen, West Germany, for certain metal alloys. The major constituents are chromium, nickel and silicium, for example, 20 percent chromium, 12 percent nickel and 2 percent silicium.

In accordance with the invention, an evaporator crucible for vacuum depositing systems comprises a crucible having a bottom with at least one bottom opening for the introduction of evaporation material in rod form, and having a metal crucible rim disposed at a distance from the bottom opening, and having a coolant passage. The crucible also includes a lagging comprising ceramic material provided internally on at least a portion of the depth of the crucible rim.

For a better understanding of the invention, together with other and further objects thereof, reference is made to the following description, taken in connection with the accompanying drawings, and its scope will be pointed out in the appended claims.

Figure 2:
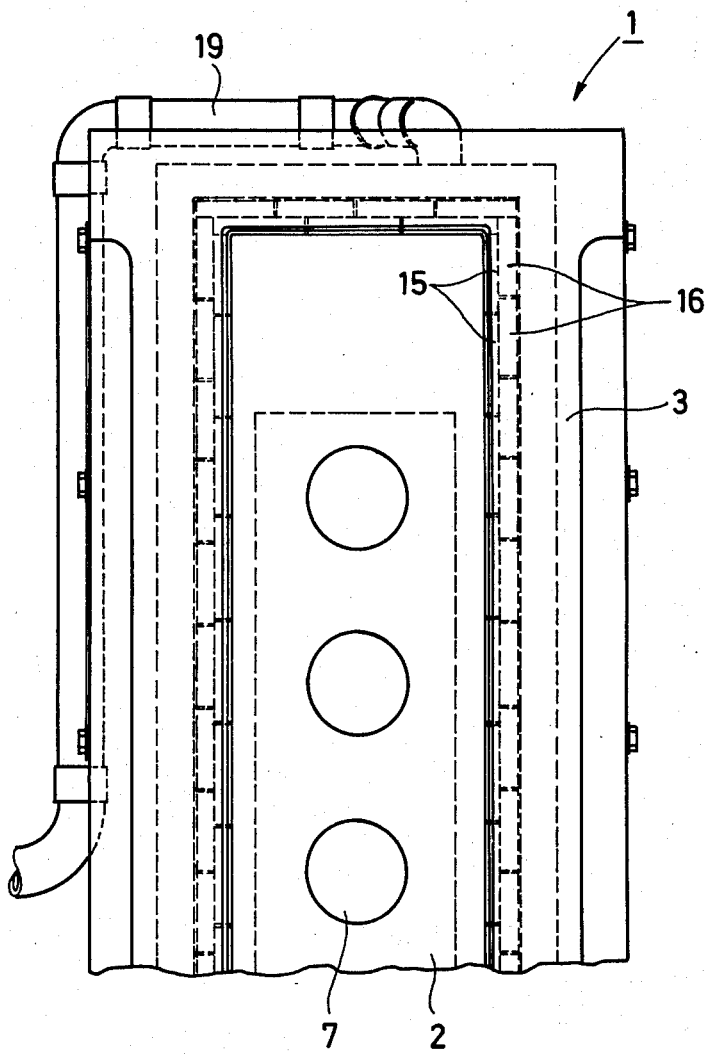

Referring now to the drawings:

FIG. 1 shows a vertical cross section through an evaporator crucible along the axis of a bottom opening; and FIG. 2 shows a plan view of the FIG. 1 embodiment.

In FIG. 1 there is shown an evaporator crucible 1 whose parts include a crucible bottom 2 and a crucible rim 3. Both parts preferably comprise copper and are provided with coolant passages 4 and 5. The crucible bottom and rim are held together by a frame 6 which has an L-shaped cross section.

In the crucible bottom 2 there is provided a series of bottom openings 7 through which material in rod form (not shown) can be fed from the bottom. The evaporator crucible 1 rests on a base 8 which likewise preferably is made of metal and provided with coolant passages 9. The bottom opening 7 preferably is continued into the base 8, and guiding rails 10 preferably adjoin it at the bottom of the opening. The entire arrangement preferably is supported by means of a flange 11 on the floor 12 of a vacuum chamber surrounding the evaporator crucible itself and the material to be evaporated.

The crucible rim 3 preferably has on its inner periphery a continuous wall surface 13 whose generatrix is perpendicular. Along this wall surface 13 there is machined into the crucible bottom 2 a peripheral groove 14 having a certain width and depth. Both on the bottom of the groove 14 and in front of the wall surface 13 there preferably are strips of sheet metal. Ceramic blocks 15 and 16 of magnesium oxide are inserted into the groove 14. Magnesium oxide is especially suitable for the evaporation of cobalt-nickel alloys. For other evaporation materials or less exacting requirements, other ceramic materials can be used which are sufficiently stable at the high working temperatures.

The ceramic blocks 15 preferably form a continuous row on the inside, while ceramic blocks 16 preferably form a continuous row on the outside, between which joints are disposed peripherally and perpendicular to the periphery. The joints perpendicular to the periphery preferably are offset from one another, preferably by about half of the length of a ceramic block. The ceramic blocks together form a lagging 17. To shield this lagging 17 at the top, the metal crucible rim 3 preferably has a peripheral lip 18 overlapping the ceramic blocks 15 and 16 at least partially. The ceramic blocks preferably are thus held inescapably in the groove 14.

As already stated, the ceramic blocks preferably comprise oxidic materials and preferably are in the form of small slabs of a thickness of several millimeters. The arrises are well rounded to prevent contamination of the melt by particles breaking out of the arrises.

In FIG. 2, the same parts as in FIG. 1 are provided with the same reference numbers. It is to be noted that the ceramic blocks 15 and 16 are disposed respectively in two rows along the crucible rim, expansion joints being present. The offsetting of the individual joints can easily be seen. The part numbered 19 is a coolant-carrying pipe running to the crucible bottom 2.

While there has been described what is at present considered to be the preferred embodiment of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. An electron-beam evaporator crucible for vacuum depositing systems, comprising:
    a crucible bottom with a wall surface forming a plurality of bottom openings for the introduction of evaporation material in rod form, and a metal crucible rim having a wall surface disposed at a distance from the bottom openings, and a coolant passage in said crucible rim; and
    a lagging comprising ceramic material provided internally on at least a portion of the depth of said crucible rim.

2. An evaporator crucible in accordance with claim 1, in which said ceramic lagging comprises individual ceramic building blocks.

3. An evaporator crucible in accordance with claim 2, in which said ceramic lagging comprises at least two rows of ceramic bulding blocks having joints which are offset from one another.

4. An evaporator crucible in accordance with claim 3, in which said metal crucible rim has a peripheral projection overlapping said ceramic building blocks at least partially.

5. An evaporator crucible in accordance with claim 1, in which said ceramic material comprises compressed magnesium oxide.

6. An evaporator crucible in accordance with claim 2, which includes strips of metal disposed between said ceramic building blocks and said metal crucible rim.

* * * * *